(12) United States Patent
Onodera

(10) Patent No.: US 6,734,075 B2
(45) Date of Patent: May 11, 2004

(54) CMOS DEVICE HAVING HIGH-DENSITY RESISTANCE ELEMENTS

(75) Inventor: Shigeki Onodera, Kanagawa (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 09/314,011

(22) Filed: May 19, 1999

(65) Prior Publication Data

US 2001/0049171 A1 Dec. 6, 2001

(30) Foreign Application Priority Data

May 20, 1998 (JP) ............................................. 10-138818

(51) Int. Cl.[7] ............................................... H01L 21/20
(52) U.S. Cl. ..................... 438/382; 438/381; 438/383; 438/384; 438/385; 257/528; 257/379; 257/536; 257/537; 257/538; 257/516; 257/218; 257/904
(58) Field of Search ................................. 438/683, 649, 438/426, 328, 305, 303, 294, 261, 252, 251, 250, 234, 203, 202, 162, 144, 228, 781, 298, 276, 289, 291, 153–154, 199, 210; 257/369, 371–372

(56) References Cited

U.S. PATENT DOCUMENTS

| | | | | |
|---|---|---|---|---|
| 3,879,236 A | * | 4/1975 | Langdon ..................... 438/383 |
| 4,391,650 A | * | 7/1983 | Pfeifer et al. ............... 438/210 |
| 4,549,340 A | | 10/1985 | Nagasawa et al. |
| 4,828,629 A | * | 5/1989 | Ikeda et al. ................ 148/33.3 |
| 4,902,640 A | * | 2/1990 | Sachitano et al. .......... 438/202 |
| 4,947,192 A | * | 8/1990 | Hawkins et al. ............. 347/59 |
| 4,947,232 A | * | 8/1990 | Ashida et al. .............. 257/336 |
| 5,114,868 A | | 5/1992 | Yoshida |
| 5,116,775 A | * | 5/1992 | Katto et al. ................. 438/241 |
| 5,134,088 A | * | 7/1992 | Zetterlund ................. 438/210 |
| 5,166,770 A | * | 11/1992 | Tang et al. ................. 257/770 |
| 5,181,092 A | * | 1/1993 | Atsumi ........................ 257/361 |
| 5,190,888 A | * | 3/1993 | Schwalke et al. ........... 438/228 |
| 5,214,497 A | * | 5/1993 | Nanba et al. ................ 257/528 |
| 5,227,327 A | * | 7/1993 | Sasaki ......................... 438/382 |
| 5,356,825 A | * | 10/1994 | Hozumi et al. ............. 438/385 |
| 5,371,024 A | * | 12/1994 | Hieda et al. ................. 438/291 |
| 5,489,547 A | * | 2/1996 | Erdeljac et al. ............. 438/238 |
| 5,525,535 A | * | 6/1996 | Hong ........................... 438/228 |
| 5,541,442 A | * | 7/1996 | Keil et al. .................... 257/533 |
| 5,565,367 A | * | 10/1996 | Lee ............................... 438/134 |
| 5,583,367 A | * | 12/1996 | Blossfeld ..................... 257/426 |
| 5,587,696 A | * | 12/1996 | Su et al. ....................... 338/314 |
| 5,589,410 A | * | 12/1996 | Sato et al. .................... 438/291 |
| 5,608,259 A | * | 3/1997 | DeShazo et al. ............ 257/547 |
| 5,622,887 A | * | 4/1997 | Miwa et al. ................. 438/202 |
| 5,679,593 A | * | 10/1997 | Miller et al. ................ 438/210 |
| 5,684,323 A | * | 11/1997 | Tohyama ..................... 257/363 |

(List continued on next page.)

FOREIGN PATENT DOCUMENTS

| | | | | | |
|---|---|---|---|---|---|
| JP | 60128651 A | * | 7/1985 | ........... H01L/27/04 |
| JP | 05243523 A | * | 9/1993 | ......... H01L/27/108 |

*Primary Examiner*—George Eckert
*Assistant Examiner*—José R. Díaz
(74) *Attorney, Agent, or Firm*—Whitham, Curtis & Christofferson, P.C.

(57) ABSTRACT

A CMOS device includes a reverse electric conduction type well (2) formed on a monoelectric conduction type semiconductor substrate (1), a first MOS transistor (3) of a reverse electric conduction type channel formed on a surface of the semiconductor substrate, and a second MOS transistor (4) of monoelectric conduction type channel is formed on a surface of the well. In the present invention, resistance elements (8R, 7R, 2R) are formed in the semiconductor substrate on a lower side of a thick field oxide film (9) covering a surface of the semiconductor substrate. Further, a second resistance element (11R) composed of a polycrystal silicon layer is formed on an upper side of the field oxide film.

10 Claims, 9 Drawing Sheets

U.S. PATENT DOCUMENTS

| | | | | |
|---|---|---|---|---|
| 5,707,886 A | * | 1/1998 | Consiglio et al. | 438/200 |
| 5,773,872 A | * | 6/1998 | Kobatake | 257/532 |
| 5,925,922 A | * | 7/1999 | Rountree et al. | 257/536 |
| 5,940,734 A | * | 8/1999 | Inoue | 438/781 |
| 5,973,375 A | * | 10/1999 | Baukus et al. | 257/399 |
| 5,982,019 A | * | 11/1999 | Doi et al. | 257/536 |
| 5,990,538 A | * | 11/1999 | Miller et al. | 257/536 |
| 6,017,799 A | * | 1/2000 | Chien et al. | 438/291 |
| 6,072,220 A | * | 6/2000 | Strack | 257/379 |
| 6,083,795 A | * | 7/2000 | Liang et al. | 438/289 |
| 6,096,589 A | * | 8/2000 | Lee et al. | 438/225 |
| 6,127,255 A | * | 10/2000 | Sugiura et al. | 438/624 |
| 6,136,634 A | * | 10/2000 | Kato et al. | 438/200 |
| 6,291,306 B1 | * | 9/2001 | Hsu et al. | 438/385 |
| 6,300,668 B2 | * | 10/2001 | Miller et al. | 257/536 |
| 6,369,654 B1 | * | 4/2002 | Inagaki et al. | 330/293 |
| 6,376,883 B1 | * | 4/2002 | Gris | 257/378 |
| 6,479,338 B2 | * | 11/2002 | Onodera et al. | 438/227 |
| 6,504,220 B2 | * | 1/2003 | Sato | 257/380 |
| 2001/0009288 A1 | * | 7/2001 | Kojima et al. | 257/343 |

* cited by examiner

US 6,734,075 B2

CMOS DEVICE HAVING HIGH-DENSITY RESISTANCE ELEMENTS

BACKGROUND OF INVENTION

1. Field of Invention

The present invention relates to a CMOS device in which a p-channel MOS transistor and an n-channel MOS transistor are formed on the same semiconductor substrate. More particularly, the present invention relates to a CMOS device in which a resistance element is formed utilizing a channel stopper and well.

2. Related Art

FIG. 5 is a cross-sectional view showing a common element structure of p-well type CMOS device. A semiconductor substrate 1 or silicon (Si) used in this structure is of n-type, and p-type well 2 is deeply formed on a surface of the semiconductor substrate 1. MOS transistor 3 of p-channel is formed on a surface of n-type semiconductor substrate 1, which MOS transistor 3 of p-channel is referred to as P-MOS in this specification, hereinafter, and MOS transistor 4 of n-channel is formed on a surface of p-type well 2, which MOS transistor 4 of n-channel is referred to as N-MOS in this specification, hereinafter. On a surface of the semiconductor substrate 1, $p^+$-type regions 5A and 5B, which become a source/drain of P-MOS 3, are shallowly formed. In the same manner, on a surface of the well 2, $n^+$-type regions 6A and 6B, which become a source/drain of N-MOS 4, are shallowly formed. In order to separate P-MOS 3 and N-MOS 4 from each other, n-type channel stopper 7 is formed on the side of P-MOS 3 on a surface of the semiconductor substrate 1, and also p-type channel stopper 8 is formed on the side of N-MOS 4 on a surface of the well 2.

Except for an element region, a surface of the semiconductor substrate 1 having the above inner structure is covered with a thick field oxide film ($SiO_2$) 9. On the other hand, a surface of the element region is covered with a thin gate oxide film ($SiO_2$) 10. On the gate oxide film 10, a polycrystal silicon layer 11, which becomes a gate electrode, is formed. As a passivation film covering an overall surface of the device, for example, BPSG (borophospho silicate glass) film 12 is laminated. On an upper surface of this BPSG film 12, metallic wiring layers 13A, 13B, 13c made of metal such as Al (aluminum) are laminated. The metallic wiring layers 13A, 13B, 13C are respectively connected with source drain regions 5A, 5B, 6A, 6B, and gate electrodes 11 via contact windows formed on BPSG film 12 and also formed in portions of a thermal oxidation film formed below BPSG film 12.

When a resistance element necessary for the circuit structure is incorporated into a CMOS device having the above structure, it is conventional to form a resistance element by various methods shown in FIGS. 6 to 9. For example, in the example shown in FIG. 6, a polycrystal silicon layer 11R is formed on a thick field oxide film 9 in a portion except for the element region of CMOS shown in FIG. 5. Both end portions of the polycrystal silicon layer 11R, which is used as a resistance element, are connected with metallic layers 13D, 13D' used for connection.

On the other hand, in the example shown in FIG. 7, a source/drain region in the element region of CMOS is extended so that it can be used as a resistance element. That is, p-type region 5R on the side of P-MOS is not separated for the source and drain, but it is formed as one continuous resistance region, and both end portions of it are connected with the metallic layers 13D, 13D'. In this element region, the polycrystal silicon film 11 for the use of gate electrode shown in FIG. 5 is not formed. In the same manner, when a resistance element is formed on the side of N-MOS, n-type region 6R is not separated as a source and drain, but it is formed as one continuous resistance region. Both end portions of this n-type resistance region 6R are connected with the metallic layers 13E. 13E' used for connection. Also in this case, the transistor is not operated as N-MOS. Therefore, the polycrystal silicon film 11 used for the gate electrode is not formed on the gate oxide film 10.

FIG. 8 is a view showing an example in which p-type well 2R formed as an element region of N-MOS is used as a resistance element. In both end portions of this p-type well 2R, $p^+$-type regions 5A, 5B utilized as a source/drain region of P-MOS are formed instead of n-type source/drain regions 6A, 6B shown in FIG. 5, and these are connected with the metallic layers 13D, 13D' used for connection. Also in this case, the transistor is not operated as N-MOS. Therefore, the polycrystal silicon film 11 used for the gate electrode is not formed on the gate oxide film 10.

FIG. 9 is a view showing an example in which an exclusive resistance element is formed in the element region of CMOS. That is, an exclusive p-type region 14R is formed between p-type source/drain regions 5A, 5B in the element region on the side of P-MOS so that they can be connected with each other, and the thus formed exclusive p-type region 14R is used as a resistance element. Both end portions of this resistance region 14R are connected with the metallic layers 13D, 13D' via p-type regions 5A, 5B. Also in this case, the transistor is not operated as P-MOS. Therefore, the polycrystal silicon film 11 used for the gate electrode is not formed on the gate oxide film 10. When an exclusive resistance element is formed in the element region on the side of N-MOS, an exclusive n-type region 15R is formed on a surface of p-type well 2. Both end portions of this n-type resistance region 15R are connected with the metallic layers 13E, 13E' via n-type source/drain regions 6A, 6B. Also in this case, the transistor is not operated as N-MOS. Therefore, the polycrystal silicon film 11 used for the gate electrode is not formed on the gate oxide film 10.

In the conventional methods shown in FIGS. 6 to 9, it is intended that all resistance elements are arranged on a plane of the semiconductor substrate. Therefore, the conventional methods are not suitable for increasing the density of arrangement of components. For example, it is considered that a resistance element of two-layer structure can be formed when the resistance element 11R, which is arranged on the substrate, composed of a polycrystal silicon layer shown in FIG. 6 is combined with one of the resistance elements 5R, 6R, 2R, 14R, 15R, which are arranged in the substrate, shown in FIGS. 7 to 9, so that it becomes possible to increase the density of arrangement of components. However, from an actual viewpoint, the resistance elements arranged in the substrate are formed on the lower side of the thin gate oxide film 10. Therefore, even if the polycrystal silicon layer 11 used for the gate electrode is formed on an upper side of this gate oxide film 10, it is difficult for the polycrystal silicon layer 11 to become a second resistance element which is electrically separated from the resistance element arranged in the substrate. This is a problem to be solved by the present invention.

SUMMARY OF INVENTION

It is an object of the present invention to provide a CMOS device in which: a plurality of resistance elements are formed at high density when resistance elements of a two-layer structure are formed, with the resistance elements being divided into an inside and an upper layer of a semiconductor substrate underneath thick field oxide film 9 high resistance elements easily formed without changing the forming process.

The above objects of the present invention can be accomplished by a CMOS device in which: a second electric conduction type well is formed on a first conduction type semiconductor substrate; a first MOS transistor of a reverse electric conduction type channel is formed on a surface of the semiconductor substrate; a second MOS transistor of first conduction type channel is formed on a surface of the well; and a resistance element is formed in the semiconductor substrate on a lower side of a thick field oxide film covering a surface of the semiconductor substrate.

According to a preferred embodiment of the present invention, the resistance element can be realized by utilizing a channel stopper used for the first MOS transistor or a channel stopper used for the second MOS transistor. The resistance element can be also realized by utilizing the well for forming the second MOS transistor. According to the more specific structure of the present invention, the second resistance element composed of a polycrystal silicon layer is further formed on an upper side of the field oxide film.

DETAILED DESCRIPTION OF PREFERRED EMBODIMENTS

Figure 1:
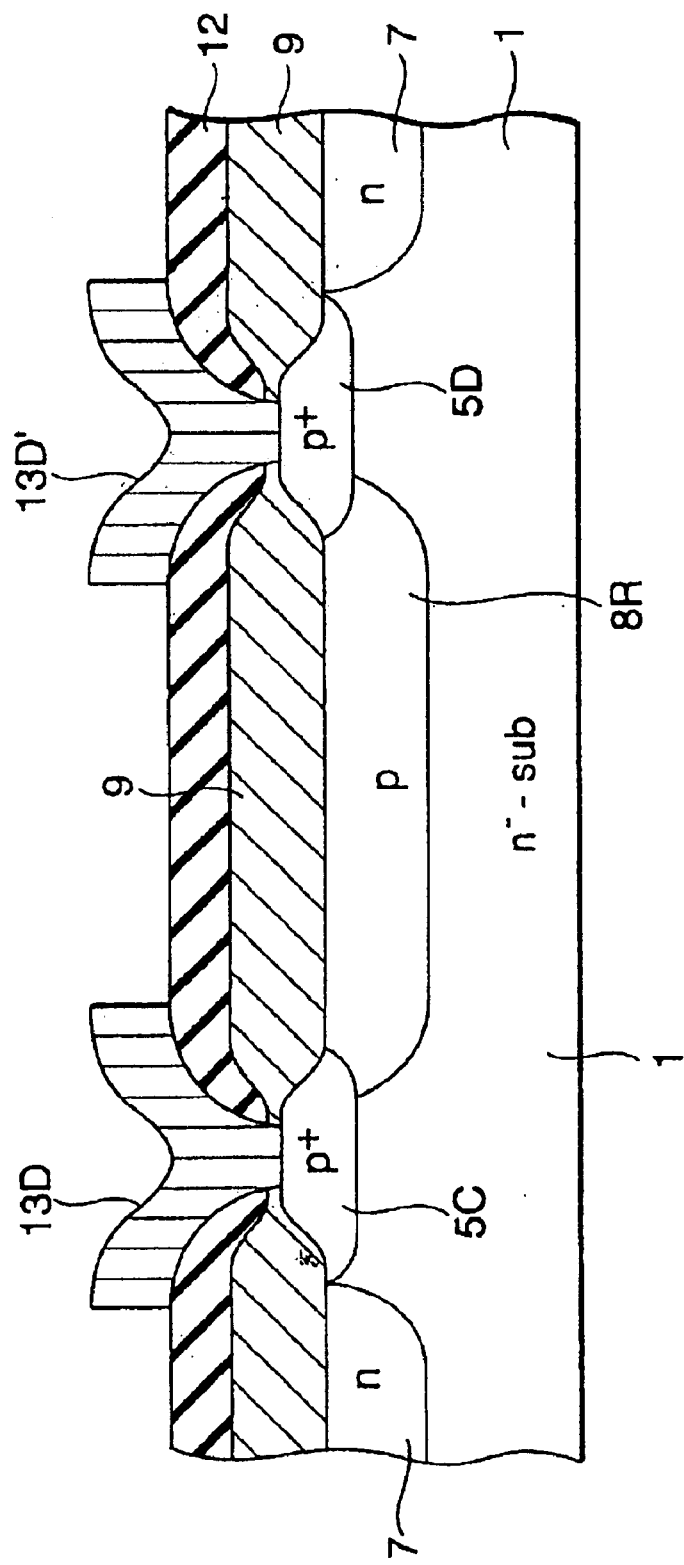
FIG. 1 is a cross-sectional view showing a first embodiment of CMOS device of the present invention.

Referring to an embodiment shown in the appended drawings, the present invention will be explained in detail, wherein similar reference numerals are used to identify features which are similar to those of FIGS. 5–9. FIG. 1 is a cross-sectional view showing a first embodiment of a CMOS device of the present invention. This view shows a resistance element 8R, which is arranged in the substrate, formed in the field region used for P-MOS 3 in the CMOS device shown in FIG. 5. On a surface of the semiconductor substrate 1, $p_+$-type regions 5C, 5D similar to source/drain are formed. However, on a surface of the substrate 1, a thin gate oxide film 10 is not formed, but a thick field oxide film 9 is formed instead of the thin gate oxide film 10. The resistance element 8R is a p-channel stopper formed on a lower side of the field oxide film 9. This p-channel diffusion 8R is extended until it teaches $p_+$-type regions 5C, 5D, and finally it is connected with metallic layers 13D, 13D'. Accordingly, it is possible to complete a resistance element 8R, which is arranged in the substrate, wherein both end portions of the resistance element 8R are connected with the metallic layers 13D, 13D'.

Figure 2:
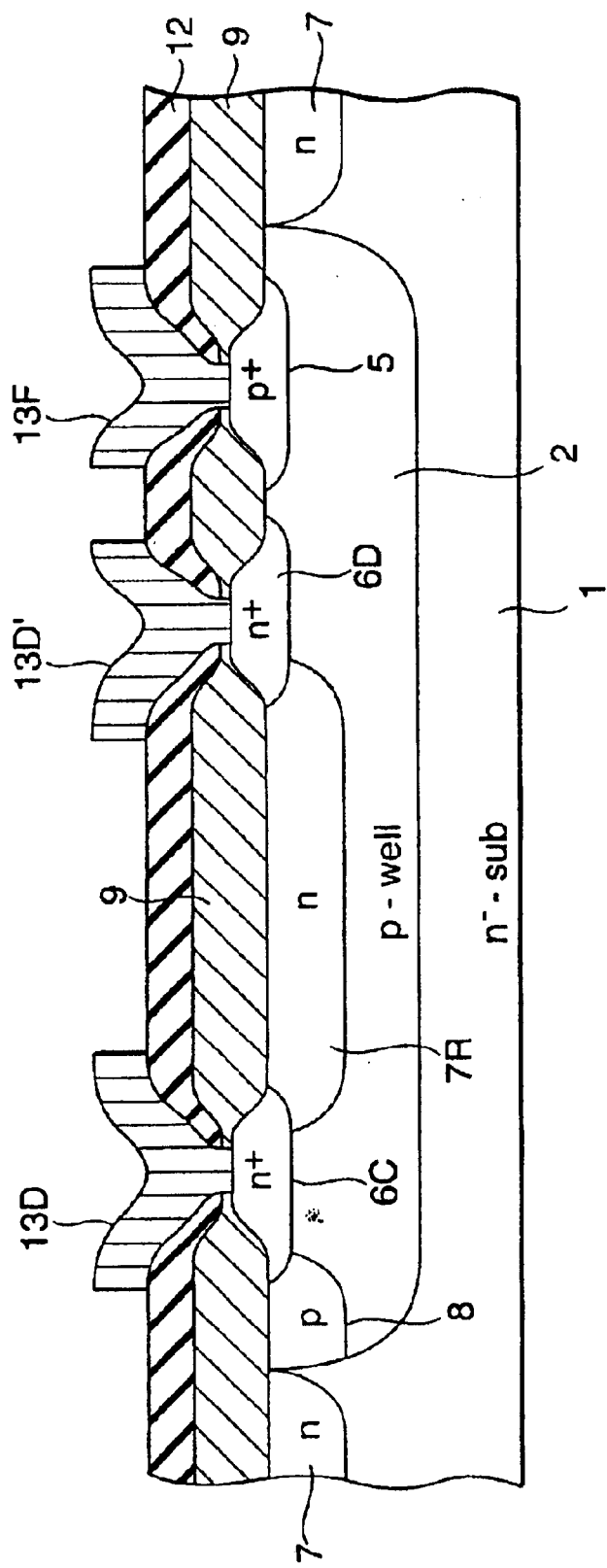
FIG. 2 is a cross-sectional view showing a second embodiment of CMOS device of the present invention.

FIG. 2 is a cross-sectional view showing a second embodiment of the CMOS device of the present invention. This view shows a resistance element 7R, which is arranged in the substrate, formed in the field region used for N-MOS 4 in the CMOS device shown in FIG. 5, that is, this view shows a resistance element 7R formed in p-type well 2. On a surface of the well 2, $n^+$-type regions 6C, 6D similar to source/drain are formed. However, on a surface of the well 2, a thin gate oxide film 10 is not formed, but a thick field oxide film 9 is formed instead of the thin, gate oxide film 10. The resistance element 7R is an n-channel stopper formed on a lower side this thick field oxide film 9. This n-channel diffusion 7R is extended until it reaches $n^+$-type regions 6C, 6D, and finally it is connected with the metallic layers 13D, 13D'. Accordingly, it is possible to complete a resistance element 7R, which is arranged in the substrate, wherein both end portions of the resistance element 7R are connected with the metallic layers 13D, 13D'. On a surface of p-well 2, $p_+$-type region 5 is used for source/drain a P-MOS device is formed and connected with the metallic layer 13F. This is used for adjusting an electric potential of a resistance island.

Figure 3:
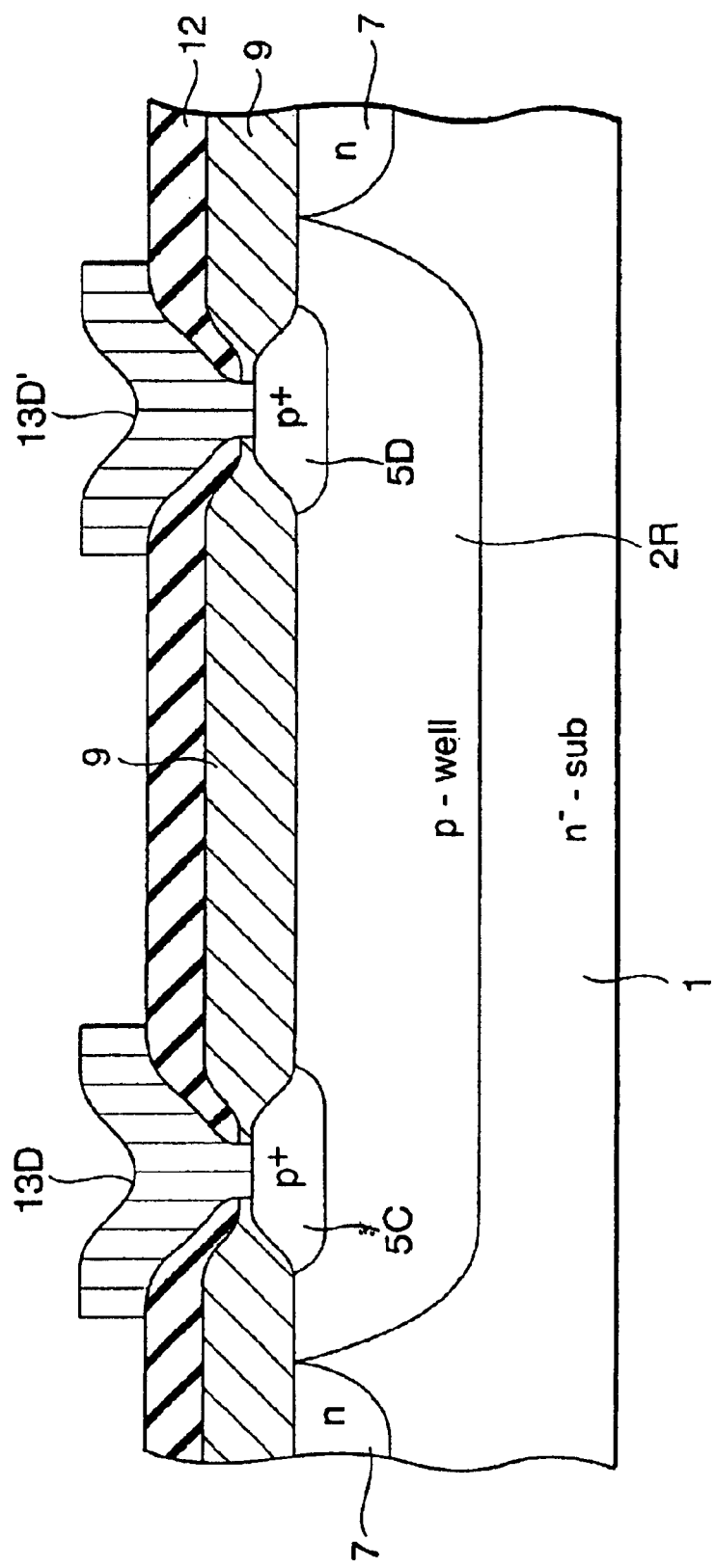
FIG. 3 is a cross-sectional view showing a third embodiment of CMOS device of the present invention.

FIG. 3 is a cross-sectional view showing a third embodiment of a. CMOS device of the present invention. This view shows an element region for the use of N-MOS 4 in the CMOS device shown in FIG. 5, that is, this view shows a resistance element 2R in the substrate in which a p-type well is utilized. On a surface of the resistance element 2R, not $n^+$-type regions similar to source/drain regions of an N-MOS (see 6A, 6B in FIG. 5) but $p_+$-type regions 5C, 5D similar to source/drain regions of a P-MOS (see 5A, 5B in FIG. 5) are formed. On the surface of the resistance element 2R, the thin gate oxide film 10 is not formed, but the thick field oxide film 9 is formed instead of the thin gate oxide film 10. The resistance element 2R is connected with the metallic layers 13D, 13D' via $p_+$-type regions 5C, 5D. Accordingly, the resistance element 2R in the substrate, at both end portions of which the metallic layers 13D, 13D' are arranged, is completed.

Figure 4:
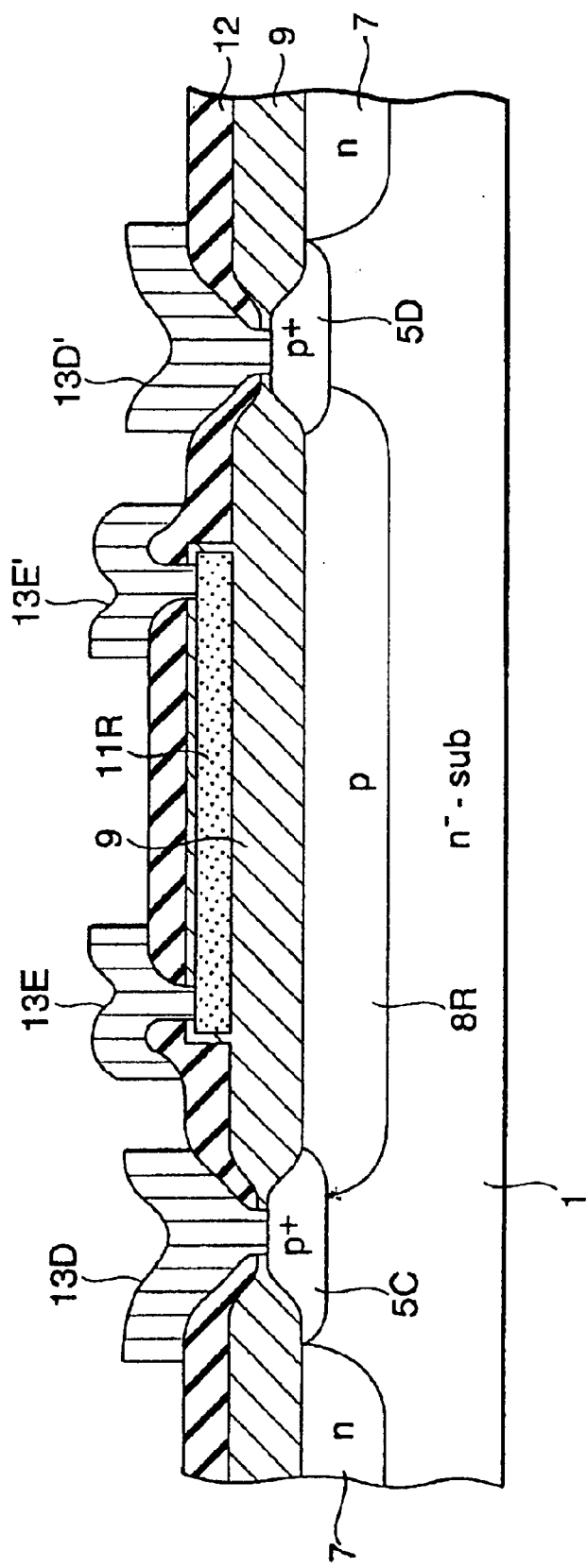
FIG. 4 is a cross-sectional view showing a fourth embodiment of CMOS device of the present invention.
Figure 5:
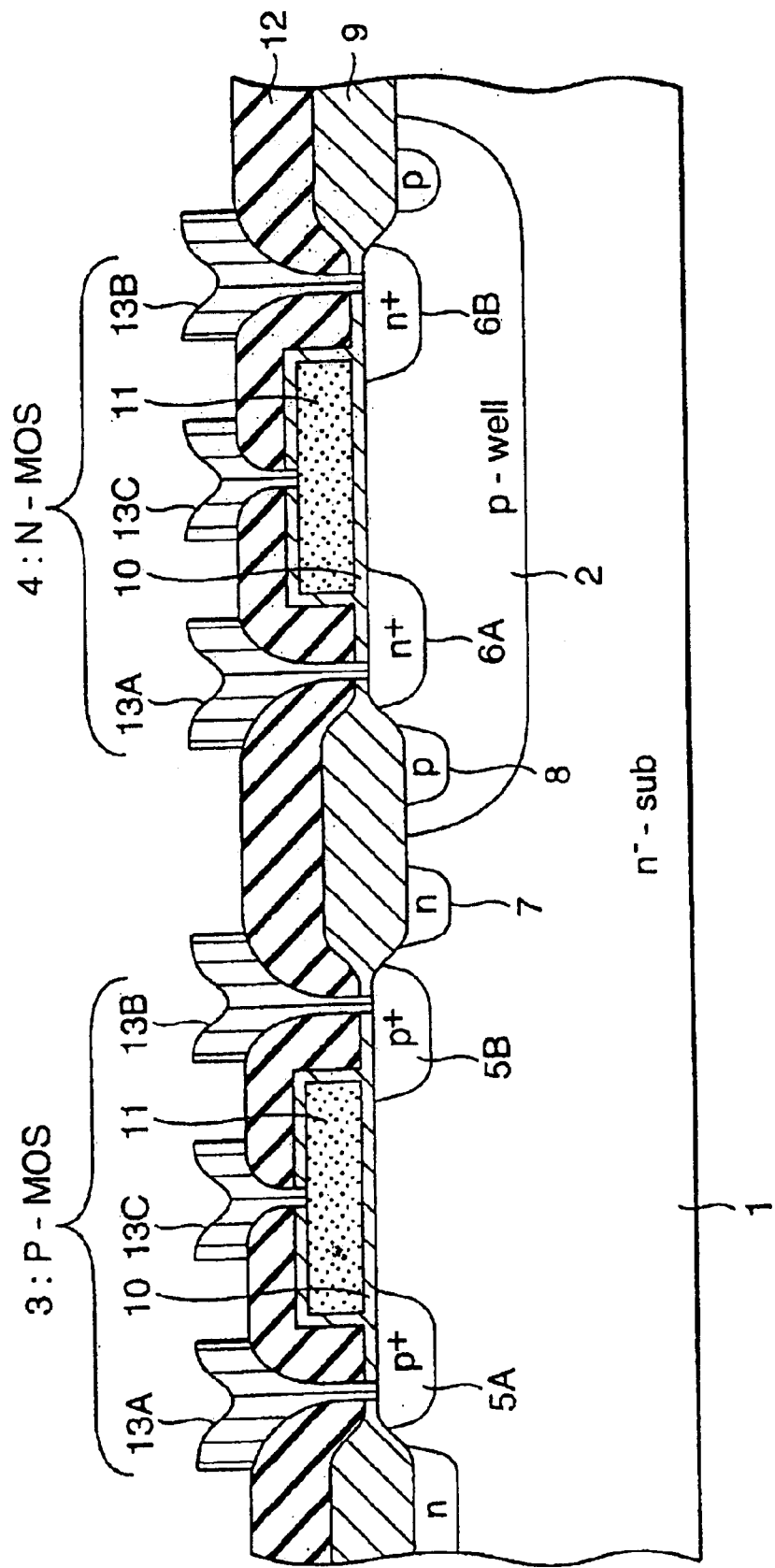
FIG. 5 is a cross-sectional view showing a common element structure of p-well type CMOS device.
Figure 6:
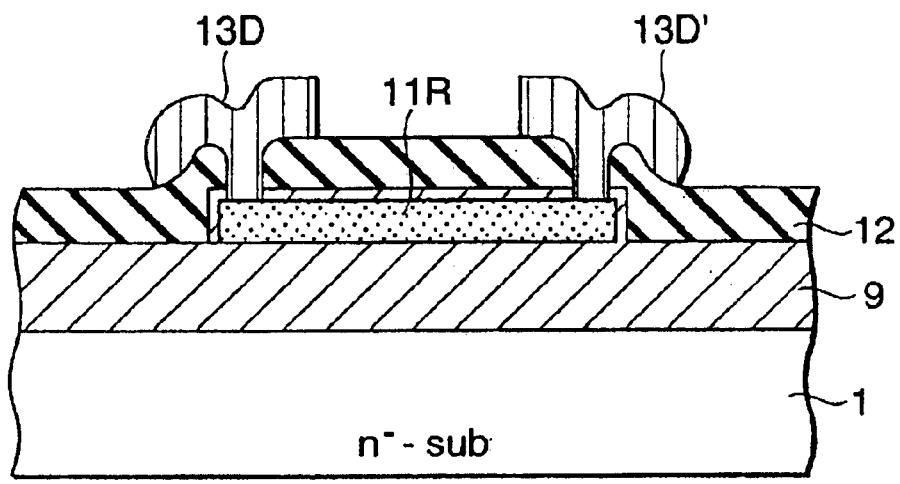
FIG. 6 is a cross-sectional view showing a first embodiment of a resistance element in conventional CMOS device.
Figure 7:
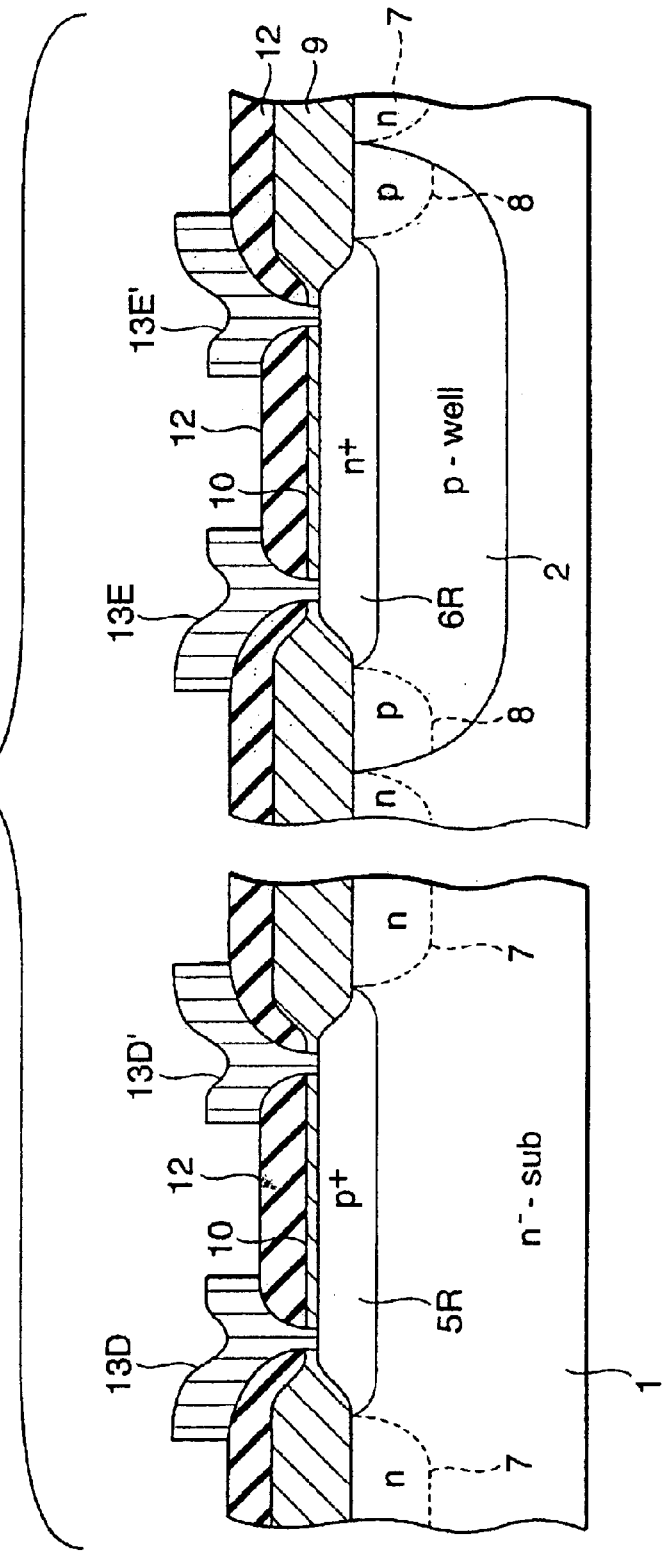
FIG. 7 is a cross-sectional view showing a second embodiment of a resistance element in conventional CMOS device.
Figure 8:
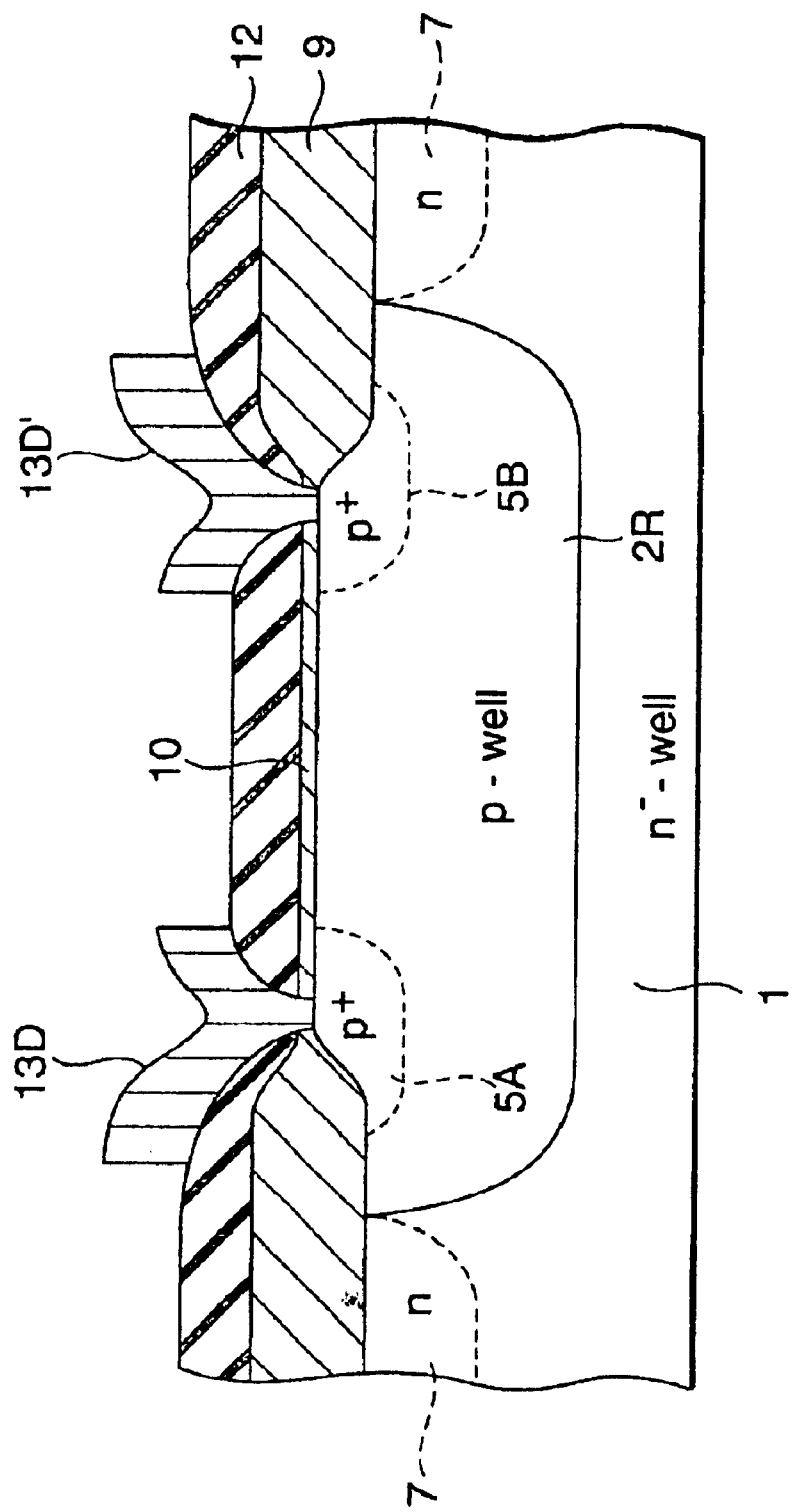
FIG. 8 is a cross-sectional view showing a third embodiment of a resistance element in conventional CMOS device.
Figure 9:
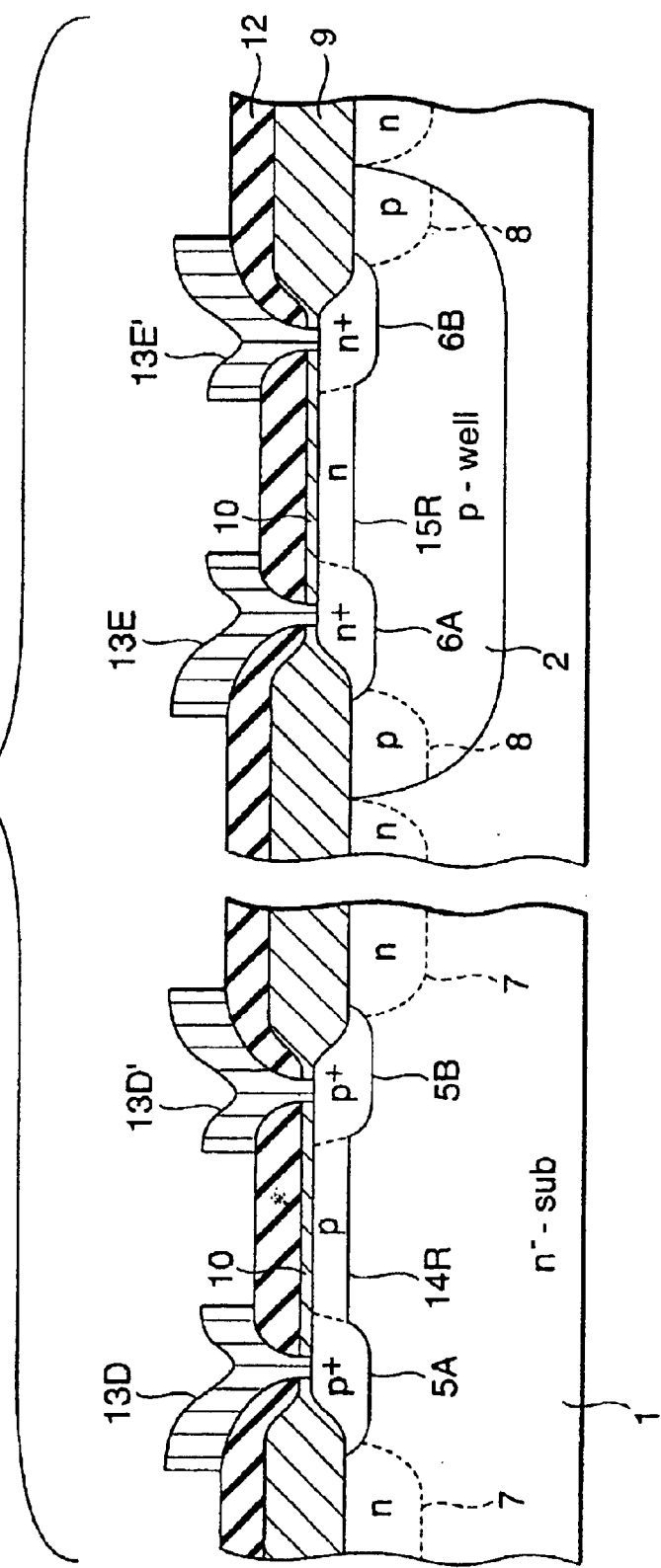
FIG. 9 is a cross-sectional view showing a fourth embodiment of a resistance element in conventional CMOS device.

FIG. 4 is a cross-sectional view showing a fourth embodiment of a CMOS device of the present invention. The structure shown in this view is based on the structure shown in FIG. 1, with the further addition of a two-layer resistance arrangement structure, in which a second resistance element 11R composed of a polycrystalline silicon layer is formed on the field oxide film 9. As explained in FIG. 1, the resistance element 8R in the substrate utilizing n-channel diffusion is formed in the substrate 1, and both end portions are connected with the metallic layers 13D, 13D' via $p_+$-type regions 5C, 5D. On the other hand, the second resistance element 11R on the substrate is formed on an upper layer of the first resistance element 8R via a thick field oxide film 9, and both end portions are directly connected with the metallic layers 13E, 13E'. Accordingly, the first resistance element 8R and the second resistance element 11R are formed into two layers, that is, the first resistance element 8R and the second resistance element 11R are formed into a multiple layer. Therefore, a plurality of resistance elements are ranged at high density. element 11R are formed into a multiple layer. Therefore, a plurality of resistance elements are arranged at high density.

The resistance element shown in the substrate shown in FIG. 4 in which two resistance layers are arranged, may be a be a resistance element shown in FIG. 2 in which p-channel stopper 7R is used. Alternatively, the resistance element in the substrate shown in FIG. 4, in which two resistance elements are arranged, may be a resistance element 2R shown in FIG. 3 in which a p-well is used. In the above explanations, n-type semiconductor substrate 1 is used, however, it should be noted that the present invention can be applied to a CMOS device of p-type semiconductor substrate and n-type well.

As described above, according to the present invention, it is possible to form a resistance element of two layer structure in which a thick field oxide film is interposed between the inside and the upper layer of the semiconductor substrate. Accordingly, it is possible to provide CMOS device into which a plurality of resistance elements are incorporated at high density.

What is claimed is:

1. A method of fabricating high-density resistance elements while simultaneously forming a CMOS device constituted of NMOS and PMOS devices and resistance elements on a common substrate comprising the steps of:

forming a substrate;

forming a first resistance element in a surface of the substrate as a diffusion region while forming a channel stopper used for forming one of the NMOS and PMOS devices;

forming a thick field oxide film over the diffusion region of the first resistance element; and forming a second resistance element on the thick field oxide film over the first resistance element, providing a two layer, high-density structure.

2. The method of fabricating high-density resistance elements recited in claim 1, wherein said second resistance element is formed of a layer of polycrystalline silicon.

3. The method of fabricating high-density resistance elements recited in claim 1, wherein said substrate is a first conductivity type and the first resistance element is formed comprising the steps of:

forming first and second enhanced second conductivity type diffusions at opposite ends of the first resistance element, the first and second enhanced second conductivity type diffusions corresponding to source and drain diffusions for one of a PMOS and an NMOS device; and forming the first resistance element as a second conductivity type diffusion in the surface of the substrate extending between said first and second enhanced second conductivity type diffusions while forming the channel stopper for one of an NMOS and a PMOS device.

4. The method of fabricating high-density elements recited in claim 3, wherein the first resistance element is connected to a pair of first electrodes through the first and second enhanced second conductivity type diffusions.

5. The method of fabricating high-density resistance elements recited in claim 1, wherein said substrate is a first conductivity type and the first resistance element is formed comprising the steps of:

forming a well of a second conductivity type in a surface of the substrate;

forming within the well of second conductivity type first and second enhanced first conductivity type diffusions at opposite ends of the first resistance element, the first and second enhanced first conductivity type diffusions corresponding to source and drain diffusions for one of an NMOS and PMOS device; and forming the first resistance element within the well of second conductivity type as a first conductivity type diffusion in the surface of the substrate of the substrate extending between said first and second enhanced first conductivity type diffusions while forming the channel stopper for one of a PMOS and NMOS device.

6. The method of fabricating high-density resistance elements recited in claim 1, further comprising the steps of:

providing a pair of first electrodes; and providing a pair of second electrodes, wherein the first resistance element is connected to a pair of first electrodes on both ends so that the first resistance element performs as a resistance when the pair of first electrodes are electrically conducting, and wherein the second resistance element is connected to the pair of second electrodes on both ends so that the second resistance element performs as a resistance when the pair of second electrodes are electrically conducting.

7. The method of fabricating high-density resistance elements recited in claim 5, wherein the first resistance element is connected to a pair of first electrodes through the first and second enhanced first conductivity type diffusions.

8. The method of fabricating high-density resistance elements while simultaneously forming a CMOS device constituted of NMOS and PMOS devices and resistance elements on a common substrate comprising the steps of:

forming a substrate having a first conductivity type;

forming a well of a second conductivity type in a surface of the substrate;

forming within the well of second conductivity type first and second enhanced second conductivity type diffusions at locations corresponding to opposite ends of a first resistance element, the first and second enhanced second conductivity type diffusions corresponding to source and drain diffusions of one of a PMOS and NMOS device, said well of second conductivity type serving as the first resistance element;

forming a thick field oxide film over the well of second conductivity type forming the first resistance element; and forming a second resistance element on the thick field oxide film over the first resistance element, providing a two layer, high-density structure.

9. The method of fabricating high-density resistance elements recited in claim 8, wherein said second resistance element is formed of a layer of plycrystalline silicon.

10. The method of fabricating high-density elements recited in claim 8, further comprising the step of providing a pair of first electrodes, wherein the first resistance element is connected to the pair of first electrodes on both ends through the first and second enhanced second conductivity type diffusions so that the first resistance element performs as a resistance when the pair of first electrodes are electrically conducting.

* * * * *